March 9, 1965 J. P. STELMAK 3,173,101

MONOLITHIC TWO STAGE UNIPOLAR-BIPOLAR SEMICONDUCTOR AMPLIFIER DEVICE

Filed Feb. 15, 1961 2 Sheets-Sheet 1

INVENTOR

JOHN P. STELMAK.

BY

Frederick Shapoe

ATTORNEY

March 9, 1965 J. P. STELMAK 3,173,101

MONOLITHIC TWO STAGE UNIPOLAR-BIPOLAR SEMICONDUCTOR AMPLIFIER DEVICE

Filed Feb. 15, 1961 2 Sheets-Sheet 2

United States Patent Office 3,173,101

Patented Mar. 9, 1965

3,173,101

MONOLITHIC TWO STAGE UNIPOLAR-BIPOLAR SEMICONDUCTOR AMPLIFIER DEVICE

John P. Stelmak, Greensburg, Pa., assignor to Westinghouse Electric Corporation, East Pittsburgh, Pa., a corporation of Pennsylvania Filed Feb. 15, 1961, Ser. No. 89,497
10 Claims. (Cl. 330—37)

This invention relates to novel semiconductor devices and in particular it concerns unipolar-bipolar monolithic semiconductor devices.

It is a primary object of the present invention to provide a monolithic semiconductor structure that functions as a unipolar-bipolar semiconductor device.

Another object of the present invention is to provide in a single semiconductor structure a two-stage cascade of transistors in which the first is a field effect transistor and is directly coupled into the second which is a common emitter bipolar transistor.

Other objects of the invention will be apparent from the following discussion and description.

In accordance with the present invention, an essentially intrinsic semiconductor wafer of one conductivity type is provided with a layer of an opposite type conductivity determining impurity in one of its major surfaces. Areas of that layer are scored off to provide mesa zones. Thereafter, there are applied to the mesas, and to the other surface of the wafer, first conductivity type concentrations. By appropriate interconnection with low conductivity paths to and between the several areas, all as more fully pointed out hereinafter, a monolithic multifunctional device is provided in which two transistors are coupled directly and the first transistor is of a field effect type and the second is a common emitter bipolar transistor. Being a unitized structure and performing a plurality of functions, it is evident that this is a prime example of a molecular engineering device and will perform a complete electronic function.

As used herein, the term "intrinsic" as applied to a body of material means that the material is relatively pure, and hence has less extrinsic semiconductivity, when compared with ordinary n and p-type semiconductor materials. The latter materials have a typical impurity concentration of about $10^{16}$ atoms per cubic centimeter or more; materials referred to as "intrinsic" herein have an impurity concentration of about $10^{14}$ to $10^{15}$ atoms per cubic centimeter or even less. As a result of these impurities in the "intrinsic" material, even though at a low concentration, the predominant type of impurity gives to the material a slightly n or p-type characteristic (sometimes known as nu and $\pi$ type material, respectively) which enables the formation of a rectifying junction by doping a portion with an impurity of type opposite to that which predominates in the "intrinsic" material. Therefore, the expression "intrinsic semiconductor material of the first conductivity type," or the like, refers to a semiconductor having a relatively low impurity concentration of which either n-type or p-type impurities predominate to some extent.

The term "mesa" as used herein refers to the shape, in elevation view, of that portion of a semiconductor body which is substantially flat-topped and has abruptly sloping sides rising from a foundation of more extensive area than the flat-topped portion. Hence, the portion of the semiconductor body between parallel grooves not extending entirely through the body may have a "mesa" shape.

The invention will be further described in conjunction with the attached drawing in which.

Figure 2:
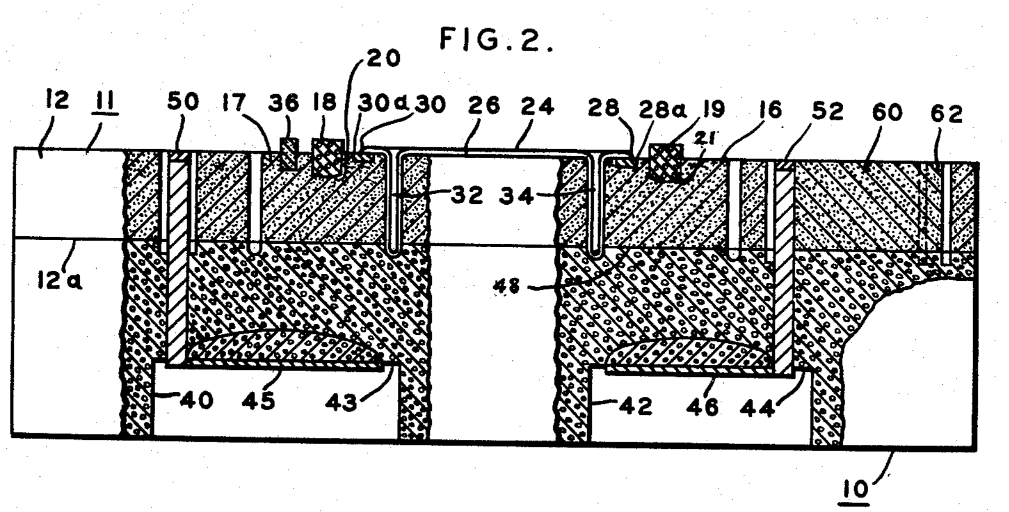
FIG. 2 is a side view, along lines II—II of FIG. 1, of a semiconductor wafer of this invention showing the relative conductivity areas therein.

It will be appreciated that these drawings are not to scale nor to a single scale; visual clarity is thus enhanced.

Referring now to the drawings, 10 indicates a body of semiconductor material such, for example, as a high resistivity n-type silicon crystal wafer. In its upper surface 11, wafer 10 is provided with sufficient p-type impurities (opposite to those of the crystal body) to form a layer or zone 12 throughout that surface of the wafer that is of opposite conductivity type. While gallium is the preferred impurity for this purpose, it is apparent that other p-type impurities from Group III-A of the Periodic Table can be used if desired. The conductivity impurity used to produce layer 12 is in all instances opposite in conductivity type to that in the main body 10 of the silicon crystal. Consequently, a P-N junction is produced at the interface 12*a* of layer 12 and body 10.

Two mesa areas 16 and 17 are defined in layer 12 by scoring or scribing off zones in layer 12; the scribe lines extend through the entire p-type layer 12, through the interface 12*a* and slightly into the main body of the wafer 10. Concentrations of first conductivity type impurities are provided on each of the mesa areas, as at 18 and 19, thereby defining gate and emitter junctions 20 and 21, respectively, at the interface of those impurity concentrations with the layer 12. It should be noted that the conductivity impurity concentrations 18 and 19 are exaggerated in appearance in the drawing for purposes of visual clarity; usually zones 18 and 19 are made by diffusion techniques or by the alloying of suitable foils to the mesas and accordingly are quite small. The n-type impurity concentrations or zones 18 and 19 are generally centrally located on the mesa areas to permit ready application of other functions and elements on those mesas.

Figure 4:
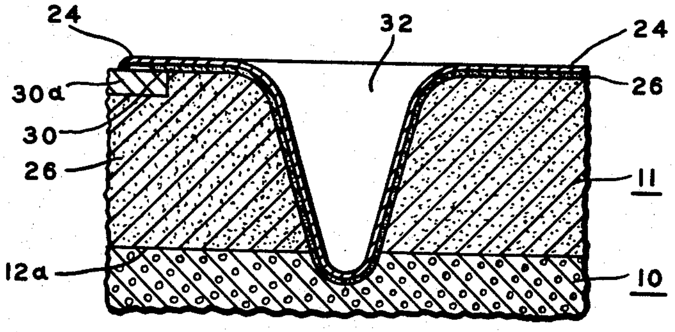
FIG. 4 is a detailed view of a scribe line and part of the mesa bridge.

The mesa areas are directly connected to one another by a low resistance path 24, for example a metallic bridge, that is in ohmic contact with each of the mesas at the p-type surface or on foils 30*a* and 28*a* provided for that purpose. Accidental short-circuiting by the bridge is readily avoided by the use of a non-conductive coating 26 underlying the bridge and extending from the one edge 28 of the bridge 24 in mesa 16 to the edge 30 of the bridge in mesa 17 (see FIG. 2). As shown in detail in FIG. 4, this non-conductor suitably coats entirely down the scribe lines, as at 32 and 34, extending to the intrinsic portion of the semiconductor body 10. While any suitable material can be used for that purpose, satisfactory experience has been had with an oxide coating, such as silicon oxide created in situ by air heating the crystal or by evaporating silicon monoxide to the area by evaporation in a vacuum. The structure on the mesas is completed by applying an ohmic contact 36 to mesa 17.

As noted hereinbefore, the device described in this application is primarily a molecular engineering device. Accordingly, in forming it, the size of the various elements is influenced by such considerations as the electrical characteristics of the materials used, impurity type and concentration, and the like. To provide the desired electrical characteristics between the various junctions, cavities 40 and 42 are cut in the lower surface of the semiconductor body 10 to a depth whereby a predetermined thickness remains between the resulting inside surfaces 43 and 44 respectively and the opposing interface 12*a* of layer 12.

Figure 3:
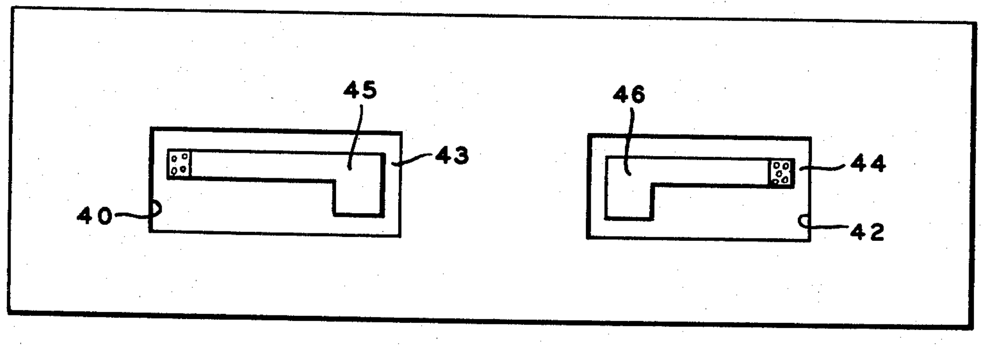
FIG. 3 is a bottom plan view of the device of FIGS. 1 and 2.

Low resistance ohmic contacts are provided in these surfaces 43 and 44 by locally applying sufficient conductivity determining impurities of a type opposite to those determining the conductivity in the layer 12. This can be accomplished by diffusion techniques through a mask, but preferably is done by alloying or fusion of suitably doped metal foils 45 and 46 to those surfaces of the cavities (see FIGS. 2 and 3). These ohmic contacts constitute the electrode to one of the gate junctions of the field effect transistor and the electrode of the collector junction of the bipolar transistor. These junctions are those integral with mesas 17 and 16, respectively, cut in the interface 12*a* by the scribe lines defining the mesas.

Figure 1:
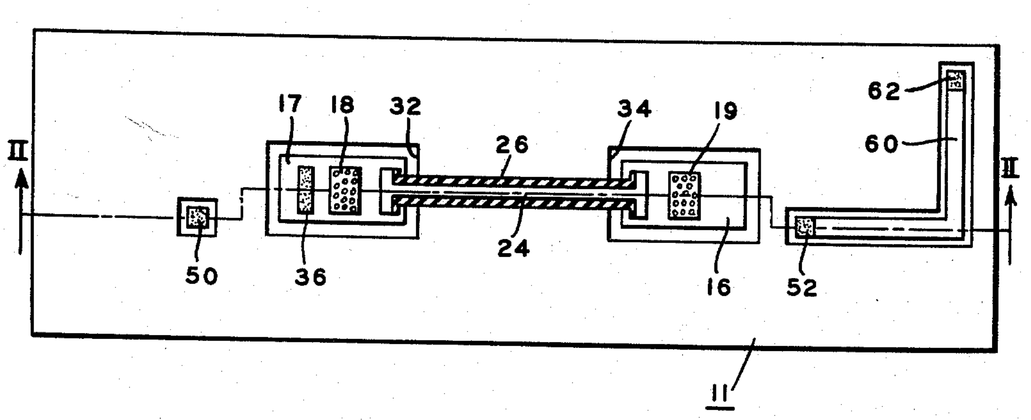
FIG. 1 is a top view of a semiconductor device in accordance with this invention.

Devices of this nature are intentionally small; consequently, it is convenient to have all leads for the resulting device terminate in one particular surface to facilitate use and minimize handling. A special technique can be applied to bring ohmic contact from the electrodes 45 and 46 in the cavities 40 and 42 to the surface of layer 12 so that external connection to those electrode areas can be made. For this purpose, small areas 50 and 52, most readily observed in FIG. 1, are scribed off in layer 12, the scribe lines as before extending through the interface 12*a* and into the intrinsic portion of the semi-conductor body 10. Ohmic or metal foils can be fused in place on the areas 50 and 52. Then low resistance paths are made between the surfaces of the thus scribed zones 50 and 52 to the electrodes 45 and 46 in cavities 40 and 42. This is done quite conveniently with the techniques described in my copending application Serial No. 38,051, filed June 22, 1960, that is, by discharging a capacitor through probes held in contact with, for example, scribed zone 50 and foil 45. The external lead to the electrode foil 45 is then made to the scribed zone 50. In similar fashion, the contact or external lead to the electrode or contact foil 46 is made to area 52 after a low resistance path has been created between those two members by capacitor discharge.

It will be noted from the drawings that zone 52 is isolated or scribed off on but three of its sides. Actually, it constitutes one end of an elongated domain or land 60 scribed in the remainder of layer 12. The other end 62 of the resulting land suitably is metallized, as by fusing a metal foil to it to facilitate external connection. The shape and length of channel 60 are largely determined by the resistance desired between the ground and the bipolar transistor output.

Semiconductor devices as just described are of importance, in addition to their functional characteristics, in view of their ease of fabrication and the resulting reliability. For example, the size of the starting block or wafer of semiconductor material, i.e. high resistivity silicon, need not be particularly uniform as long as each block exceeds predetermined minimum dimensions. This is largely a consequence of the provision of the various elements or functions in essentially isolated parts of the block. The separate elements are readily made by use of photoresist coating, masking and forms through which etching, diffusion and evaporation operations are conducted. Thus, the operations used can be performed with skills already available in the art.

Figure 5:
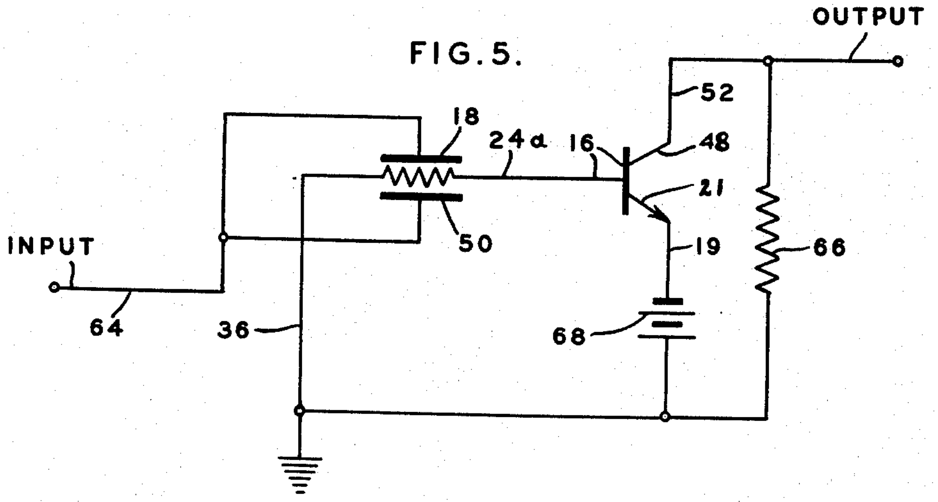
FIG. 5 is the functional diagram or equivalent circuit for the unipolar-bipolar block amplifier of FIGS. 1, 2 and 3.

The equivalent diagram and the manner of use of a unipolar-bipolar semiconductor device as just described is evident in FIG. 5. In operation, a signal is applied through line 64 between the gate, comprised of junctions associated with contacts or electrodes 18 and 50, and the source 36. The amplified signal from that transistor is led through line 24*a* (i.e. bridge 24 in FIGS. 1, 2 and 4) to the base area 16 of the bipolar transistor, where it is further amplified. The output of the bipolar transistor is evidenced across a load resistance 66 (land 60) between the lead from the collector junction 48 and the lead from the emitter junction 21. It should be noted from the circuit of FIG. 5 that a single power source 68 serves as the biasing source for both the drain supply and the collector supply, another unique characteristic of the present invention. The devices are particularly useful for amplification where high input impedances are encountered.

The preparation of a semiconductor device of the present invention by a fusion-diffuser technique is as follows: The semiconductor body can be an n-type silicon single crystal wafer, about four mils in thickness and characterized by a 100–200 ohm-centimeters resistivity and at least a 500 microsecond lifetime. Thus, it is essentially intrinsic. The crystal is provided with a p-type layer throughout its upper surface by heating the crystal for about 1½ hours in an evacuated furnace at about 1200° C. in the presence of an atmosphere of gallium generated by heating a container of gallium in the furnace at 1000° C. Experience shows that the diffused gallium produces a layer on all surfaces of the silicon crystal about 0.4 mil in thickness. The layer along the entire bottom surface is lapped off; the top remains for use in the resulting device and the side layers are permitted to remain because they do not interfere with the invention. After the bottom layer containing the gallium has been removed, cavities are cut in the resulting surface. The cavities can be provided by cutting or etching with mineral acids, such as a mixture of hydrofluoric and nitric acids, or other procedures. With an n-type silicon crystal, n-type foils are then fused to the end wall of the cavities. Preferably, antimony containing gold foils (i.e. 0.5 weight percent Sb) are used.

The ohmic contacts and junctions are then produced in the upper surface 11 of the device as shown in the drawings. Doped metal foils are placed on contacts 50, 36, 18, 30*a*, 28*a*, 19, 52, and 62; all of the foregoing except 18 and 19 are p-type foils. Since 18 and 19 constitute the junction electrodes and the junctions are produced by fusion, n-type foils are used for these members. Suitably n-type foils are antimony-doped gold. The contacts just mentioned are prepared by locating the foils as desired, placing the unit in a vacuum chamber and heating it at about 700° C. for ten minutes. Thereafter, the scribe lines that serve to isolate the mesas and the land 60 on the upper surface are produced. This is accomplished by coating the surface with a photoresist coating, as by brushing or spraying, placing a mask on the photoresist coating (i.e. Eastman Kodak's KPR) that defines the scribe lines as desired, exposing the resulting unit to ultraviolet light and then developing the photoresist coating. In the development step, the unexposed sections are dissolved away by trichloroethylene or other suitable solvent. Then the scribe lines are etched into the unit with a mineral acid mixture, such as hydrofluoric and nitric acids, the etching continuing until channels through the gallium layer and slightly into the main n-type silicon result.

A layer of silicon oxide is deposited from a heated source in a high-vacuum chamber onto the portions of the surface that are to underlay the low resistance path 24 between the mesas. After this has been accomplished, the unit is again coated with a photoresist coating and using an optical mask, an aluminum or other suitable metal is evaporated in place on the oxide support to join the mesas at the bridge contacts 30*a* and 28*a*, or to the gallium layer if such contacts are not provided. The collector and gate electrodes, 46 and 45 respectively, that are on the bottom surface of the unit are then brought to the top surface by discharging a capacitor, about 500 to 1000 microfarads capacity, at a low voltage of but a few volts through the path from gate electrode 45 to contact 50, and from collector electrode 46 to contact 52. It is to be noted that this practice destroys the junctions directly between the points of capacitor discharge, and the resulting path is but a few ohms (i.e. 1 to 5) in resistance. Lead wires are then attached; the input lead goes to contacts 18 and 50; the output lead to 52, and ground connections are made to contacts 36 and 62. A bias supply such as a battery is connected through a lead to contact 19. Any of the various known techniques for joining such leads can be used. For example, conventional thermocompression bonding or welding are satisfactory methods. Thereafter, cleaning, surface stabilization and encapsulation in the normal manner are used to complete the unit for use.

Devices as described have been made and tested for qualitative results. The tests have demonstrated that the device can readily evidence a power gain of at least 50 decibels; input impedance up to 1 megohm has been measured. The typical operating D.C. point for this block amplifier has been a total current of 2 milliamps at 10 volts.

The unique monolithic semiconductor devices of this invention can be substituted for the plurality of individual units now used in the electronic arts to provide high frequency response. Generally, it is believed that special utility is available in any amplification application where a high input impedance is experienced, as, for example, in infra-red detector and guidance systems.

As specifically described, the semiconductor device was produced by a combination of fusion and diffusion techniques. Diffusion techniques alone can, and indeed have, been used in preparing devices of the invention. Conductivity impurities and metals other than those specifically mentioned can be used, as is well known in the semiconductor art. It should also be appreciated that other semiconductor materials such as germanium, silicon carbide, indium or gallium arsenide and the like also could be used. Moreover, the specific resistivity of the semiconductor can be varied over a wide range, e.g. 100 to 500 or more ohm-centimeters.

Other variations can also be made without departing from the scope of the invention. The particular shape of the mesas and other zones provided in the one surface as well as the conductivity concentrations specified can be varied. The size, volume, length, etc. of the various elements determine the electrical characteristics of the resulting device and in turn are influenced by the electrical characteristics of the base semiconductor material as well as the impurity type and concentration used and similar considerations. Consequently, the location of the elements of a device can be varied to take advantage of the character of the semiconductor material.

From the equivalent diagram of the devices, FIG. 5, it is evident that the unit contains two built-in significant resistances. One is that represented by land 60, and constitutes the load resistance 66. The other is that of the field effect transistor and is the zone between the gate junctions, i.e. the zone of gallium layer 12 between the junction under n-type impurity concentration 18 and the junction associated with mesa 17 at the interface 12*a*. Another advantage of the invention is that the characteristics of these resistances can be readily adjusted, as desired, by etching away part of the surface of land 60 and by controlling the size of mesa 17 or impurity concentration 18 or both, since resistance is affected by the volume of material constituting it, as well as by other variables.

The devices of this invention are prepared by diffusion techniques alone as follows: Using the silicon single crystal wafer mentioned in the preceding example as well as the condition stated therein for comparable steps, gallium is diffused into the crystal. After the bottom surface is lapped off to remove the gallium layer, cavities are cut into that surface. Then phosphorus or other n-type conductivity impurity is diffused into the end walls of the cavities. After termination of this step, the crystal is exposed to heated air whereupon its entire surface is oxidized.

A photoresist coating is then applied to the top major surface. A mask defining the location for emitter and gate junctions on the upper surface is applied to the photoresist coating and the unit is exposed to ultraviolet light with the mask in place in the conventional manner. The photoresist coating is then developed, i.e. that is the junction areas are removed by trichloroethylene or other solvent, and the exposed oxide etched away by an acid such as hydrofluoric acid. Then phosphorus is diffused into the exposed silicon crystal on its upper surface to produce the impurity concentration in the gallium layer whereby the emitter and gate junctions are developed.

With the junctions thus produced, the unit is again coated with a photoresist coating on its upper surface. A mask is applied that defines all of the scribe lines. After the photoresist has been activated and the exposed oxide removed from the lines defining the scribe lines, a mixture of mineral acids is applied whereby the scribe lines are etched into the unit completely through the gallium layer and slightly into the n-type silicon. Then the unit is oxidized once again whereby the scribe line channels become oxidized. A photoresist coating is again applied and developed so that all of the oxide can be removed from portions which require ohmic contacts, i.e. contacts 50, 36, 18, 19, 52, 62 and the ends of bridge 24. An additional photoresist coating is applied and using an optical mask again, the coating is removed in the regions where the above ohmic layers are to be applied as listed above and in addition all of bridge 24. Aluminum is evaporated in place on the entire surface area. After the application of the aluminum, all photoresist coating is removed along with unwanted aluminum covering it by use of trichloroethylene or other solvent that attacks only the photoresist.

The crystal is then turned over and a photoresist coating is applied to the bottom surface, using a mask again and developing the coating to expose the phosphorus concentrations in the cavities. Then aluminum is evaporated in place on the exposed areas thereby providing ohmic contacts to them. At this point, the gate electrode 45 and collector electrode 46 are brought to their respective ohmic contacts 50 and 52 on the upper surface by discharging capacitors in the same manner as stated in the examples above. The lead wires are then attached to the unit by a process such as thermocompression bonding or welding. Cleaning, surface stabilization, and encapsulation are then accomplished as is normal for most semiconductor devices.

In accordance with the provisions of the patent statutes, the invention has been explained and there has been illustrated what is now believed to be its best embodiment. However, it should be understood that the invention can be practiced otherwise than as specifically illustrated and described.

I claim as my invention:

1. A monolithic unipolar-bipolar semiconductor amplifier comprising a body of intrinsic semiconductor material of one conductivity type having opposed major surfaces, a layer of opposite conductivity type semiconductor material in one of said major surfaces whereby a P-N junction is defined at the interface of said layer and the remainder of said body of semiconductor material, spaced mesa zones scribed in said layer by scribe lines that cut through said interface completely around said mesas, a concentration of said one conductivity type semiconductor material in the surface of each of said mesa zones thereby providing additional rectifying junctions in each of said mesas, insulation means integral with said layer and extending between said mesa zones, a low resistance electrical path connecting said mesa zones and terminating in ohmic contact with said mesas adjacent said concentrations of one conductivity material therein, said low resistance path being insulated from said layer between the mesas by said insulation means, low resistance contacts in said other major surface of the body of semiconductor material opposite the junctions in said mesa zones, low resistance paths through the semiconductor body and said layer connecting said low resistance contacts with ohmic contacts on the surface of said layer adjacent said mesas, an additional zone scribed in said layer and including a first of said ohmic contacts, the scribe line for said additional zone cutting through said interface around said additional zone, an ohmic contact for applying a biasing voltage to said additional zone, said ohmic contact being remote from said first ohmic contact whereby voltage is supplied to said first ohmic contact through a significant resistance comprising the portion of said layer therebetween, and an ohmic contact on the one of said mesas remote from said additional zone.

2. A monolithic unipolar-bipolar semiconductor device comprising a body of intrinsic semiconductor material of one conductivity type having opposed major surfaces, a layer of opposite conductivity type semiconductor material in one of said major surfaces, spaced mesa zones in said layer, said mesa zones being physically separated from direct contact with the remainder of said layer, a concentration of first conductivity type semiconductor material in the surface of each of said mesa zones thereby providing rectifying junctions in each of said mesas, a low resistance electrical path in ohmic contact with and connecting said mesa zones and terminating adjacent said concentrations of first conductivity material therein, low resistance contacts in said other surface of said body of semiconductor material opposite said junctions in said mesa zones, low resistance paths connecting said contacts in said other surface to ohmic contacts on the surface of said layer adjacent said mesa zones, and an ohmic contact on said layer of opposite conductivity type semiconductor material remote from said paths and from said mesa zones and being electrically connected through said layer to one of said ohmic contacts terminating said paths through said body of semiconductor material.

3. A monolithic unipolar-bipolar semiconductor device comprising a body of intrinsic semiconductor material of one conductivity type having opposed major surfaces, a layer of opposite conductivity type semiconductor material in one of said major surfaces, spaced mesa zones in said layer, said mesa zones being physically separated from direct contact with the remainder of said layer, a concentration of first conductivity type semiconductor material in the surface of each of said mesa zones thereby providing rectifying junctions in each of said mesas, a low resistance electrical path connecting said mesa zones and terminating adjacent said concentrations of first conductivity material therein, low resistance contacts in said other surface of said body of semiconductor material opposite said junctions in said mesa zones and an additional ohmic contact to one of said mesa zones.

4. A monolithic unipolar-bipolar semiconductor device comprising a layer of intrinsic material having a plurality of regions of impurity concentration thereon to form a unipolar amplifier element having source, gate and drain regions and a bipolar amplifier element having base, collector and emitter regions, said layer of intrinsic material extending through and joining said amplifier elements into a unitary body while serving substantially to electrically isolate said transistor areas, said drain region electrically coupled by conductive means extending over the surface of said unitary body to said base region to form within said unitary body the functional equivalent of a two stage amplifier.

5. A monolithic unipolar-bipolar semiconductor device comprising a layer of intrinsic material having a plurality of regions of impurity concentration therein to form a field effect transistor and a bipolar transistor, first and second regions having a first type impurity disposed on one surface of said layer of intrinsic material and forming the drain region of said field effect transistor and the base region of said bipolar transistor, third and fourth regions having an impurity opposite in type to said first type impurity disposed respectively on said first and second regions and forming the first gate region of said field effect transistor and the emitter of said bipolar transistor fifth and sixth regions having an impurity of opposite type to said first type impurity disposed on the surface of said layer of intrinsic material respectively opposite said first and second regions and defining the second gate region of said field effect transistor and the collector region of said bipolar transistor, a seventh region having an impurity of said first type to form the source region of said field effect transistor, said layer of material extending through and joining said transistors into a unitary body while serving substantially to electrically isolate said transistors, said drain region electrically coupled by conductive means extending over the surface of said unitary body to said base region to form within said unitary body the functional equivalent of a two stage amplifier of a field effect transistor coupled into a common emitter bipolar transistor.

6. A monolithic unipolar-bipolar semiconductor device comprising a layer of intrinsic material having a plurality of regions of impurity concentration thereon to form a field effect transistor and a bipolar transistor, first and second regions having a first type impurity disposed on one surface of said layer of intrinsic material and forming the drain region of said field effect transistor and the base region of said bipolar transistor, third and fourth regions having an impurity opposite in type to said first type impurity disposed respectively on said first and second regions and each forming the first gate region of said field effect transistor and the emitter of said bipolar transistor, fifth and sixth regions having an impurity opposite type to said first type impurity disposed on the surface of said layer of intrinsic material respectively opposite said first and second regions and defining the second gate region of said field effect transistor and the collector region of said bipolar transistor, a seventh region having an impurity of said first type to form the source region of said field effect transistor, said layer of intrinsic material extending through and joining said transistors into a unitary body while serving substantially to electrically isolate said transistors, said drain region electrically coupled to said base region by a conductive strip disposed on the surface of said unitary body to form within said unitary body the functional equivalent of a two stage amplifier of a field effect transistor coupled into a common emitter bipolar transistor, means to apply an input signal to be amplified to said first and second gate regions of said field effect transistor, means to apply a bias potential to the emitter region of said bipolar transistor area and the source region of said field effect transistor, and means to derive an output signal from the collector region of said bipolar transistor area.

7. A monolithic unipolar-bipolar semiconductor device comprising: a unitary body of material having a plurality of impurity doped semiconductive regions thereon and a plurality of ohmic contacts on said semiconductive regions to form a unipolar amplifier element and a bipolar amplifier element; said unipolar amplifier element including a first of said semiconductive regions, first and second ohmic contacts serving as source and drain contacts on said first semiconductive region, and at least one gate region on said first semiconductive region and forming a p-n junction therewith to permit control of current between said source and drain contacts; said bipolar amplifier element including a second of said semiconductive regions serving as a base region and emitter and collector regions adjacent said base region and forming p-n junctions therewith; each of said gate, base, emitter and collector regions having one of said plurality of ohmic contacts thereon; a conductive interconnection joining one of said contacts on said first semiconductive region and the ohmic contact on said base region, said interconnection extending over a layer of insulating material disposed on said unitary body; said first and second semiconductive regions being separated so as to minimize electrical interaction therebetween except through said conductive interconnection.

8. A monolithic unipolar-bipolar semiconductor device in accordance with claim 7 wherein: said first and second regions are of a first semiconductivity type and said at least one gate region and said emitter and collector regions are of a second semiconductivity type.

9. A monolithic unipolar-bipolar semiconductor device in accordance with claim 7 further comprising: a third impurity doped semiconductive region within said unitary body of material to provide a resistive region, said resistive region being connected by a conductive interconnnection to one of said plurality of impurity doped semiconductive regions and being of the same semiconductivity type as said first and second regions.

10. An amplifier including a monolithic unipolar-bipolar semiconductor device as defined in claim 7 wherein a potential supply source is electrically connected between the ohmic contact on said emitter region and the other one of said contacts on said first semiconductive region with the side of said supply source connected to said other one of said contacts also connected through a load impedance to the ohmic contact on said collector region whereby said supply source simultaneously provides the drain supply for said unipolar amplifier element and the collector supply for said bipolar amplifier element.

References Cited by the Examiner

UNITED STATES PATENTS

| | | | |
|---|---|---|---|
| 2,764,642 | 9/56 | Shockley | 330—37 |
| 2,820,154 | 1/58 | Kurshan | 330—37 |
| 2,954,486 | 9/60 | Doucette | 317—235 |
| 3,026,485 | 3/62 | Suran | 307—88.5 |
| 3,070,762 | 12/62 | Evans | 317—235 |
| 3,074,003 | 1/63 | Luscher | 317—235 |

NATHAN KAUFMAN, *Acting Primary Examiner.*

ELI J. SAX, ROY LAKE, *Examiners.*